(12) United States Patent
Magni

(10) Patent No.: US 10,141,240 B2
(45) Date of Patent: Nov. 27, 2018

(54) SEMICONDUCTOR DEVICE, CORRESPONDING CIRCUIT AND METHOD

(71) Applicant: STMICROELECTRONICS S.R.L., Agrate Brianza (IT)

(72) Inventor: Pierangelo Magni, Villasanta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 19 days.

(21) Appl. No.: 15/675,483

(22) Filed: Aug. 11, 2017

(65) Prior Publication Data

US 2018/0190563 A1 Jul. 5, 2018

(30) Foreign Application Priority Data

Jan. 3, 2017 (IT) ................................. 10201700518

(51) Int. Cl.
*H01L 23/00* (2006.01)
*H01L 23/367* (2006.01)
*H01L 23/373* (2006.01)

(52) U.S. Cl.
CPC ...... *H01L 23/3672* (2013.01); *H01L 23/3735* (2013.01)

(58) Field of Classification Search
CPC .................................................. H01L 23/3672
See application file for complete search history.

(56) References Cited

U.S. PATENT DOCUMENTS

| 5,285,352 | A | * | 2/1994 | Pastore | .................. H01L 23/36 165/185 |
| 5,306,670 | A | | 4/1994 | Mowatt et al. | |
| 2006/0191711 | A1 | * | 8/2006 | Cho | .................... H01L 23/5389 174/260 |
| 2009/0283895 | A1 | | 11/2009 | Kikuchi et al. | |
| 2011/0108971 | A1 | | 5/2011 | Ewe et al. | |
| 2011/0127675 | A1 | | 6/2011 | Ewe et al. | |
| 2014/0070397 | A1 | | 3/2014 | Viswanathan et al. | |
| 2015/0206820 | A1 | | 7/2015 | Standing | |

FOREIGN PATENT DOCUMENTS

DE 102010038154 A1 5/2011

OTHER PUBLICATIONS

Yang et al., "Reliability Modeling on a MOSFET Power Package Based on Embedded Die Technology", *10th Int. Conf. on Thermal, Mechanical and Multiphysics Simulation and Experiments in Micro-Electronics and Micro-Systems, EuroSimE 2009*, 6 pages.
Morianz et al., "Embedded Power Electronics on the way to be launched", European Microelectronics Packaging Conference, Sep. 2015, Friedrichshafen, Germany, 5 pages.
Markus Leitgeb, "Advanced PCB Technologies", Feb. 22, 2016, 115 pages.

* cited by examiner

*Primary Examiner* — William Harriston
(74) *Attorney, Agent, or Firm* — Seed Intellectual Property Law Group LLP

(57) ABSTRACT

A semiconductor device includes a layered package having a semiconductor die embedded therein, the semiconductor die coupled with a thermally-conductive element. The layered package includes, e.g., PCB boards with an intermediate layer having the semiconductor die arranged therein, and a pair of outer layers, with the thermally-conductive element including a thermally-conductive inlay in one of the outer layers.

19 Claims, 1 Drawing Sheet

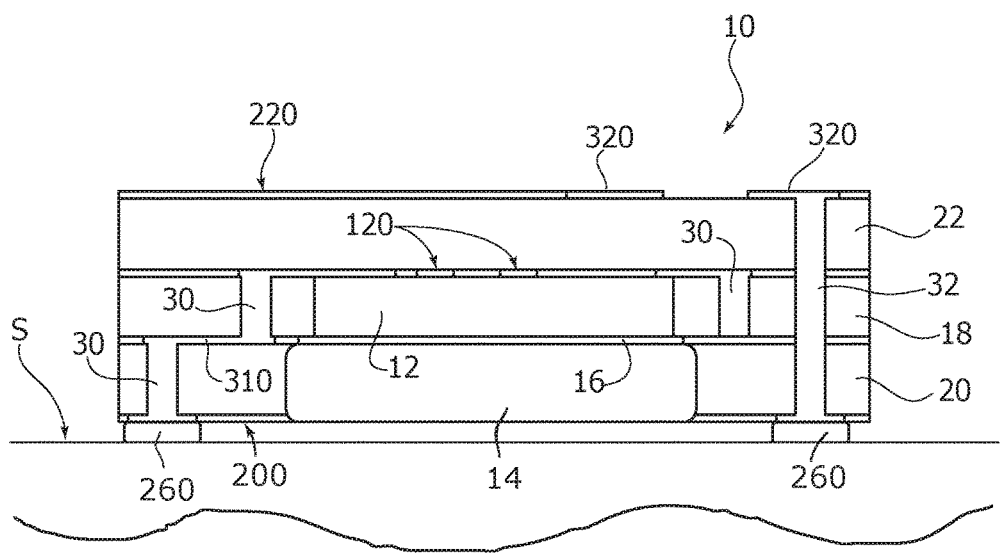
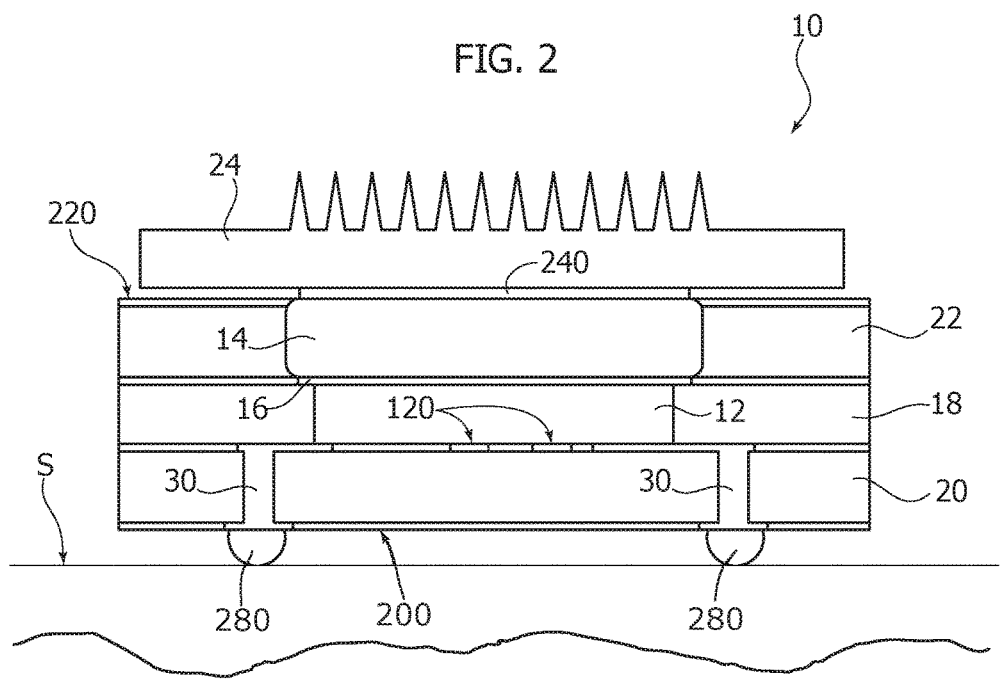

SEMICONDUCTOR DEVICE, CORRESPONDING CIRCUIT AND METHOD

BACKGROUND

Technical Field

The description relates to semiconductor devices.

Description of the Related Art

Certain semiconductor devices include embedded dice, e.g., with semiconductor chips or dice arranged (fully) inside a substrate, e.g., an organic substrate, in order to decrease the overall package size. This may permit assembling other passive or active components on internal/external surfaces of the substrate.

Thermal dissipation in those configurations may be poor due, e.g., to the nature of the organic substrate, and may become critical in those arrangements where input/output connections of the system are through a connector.

Thermal dissipation may be facilitated by resorting to a "die facing down" configuration in the place of a "die facing up" configuration, thanks to, e.g., lands or balls providing indirect thermal paths/external interfaces.

In that case, the possibility exists of taking steps such as increasing the amount of balls, putting the system in an air flow, gluing the PCB to a dissipative metal layer or slug acting as a heatsink.

Documents such as:

D. Yang, et al.: "Reliability Modeling on a MOSFET Power Package Based on Embedded Die Technology", 10$^{th}$ Int. Conf. on Thermal, Mechanical and Multiphysics Simulation and Experiments in Micro-Electronics and Micro-Systems, EuroSimE 2009, pp. 1-6;

M. Morianz, et al.: "Embedded Power Electronics on the way to be launched", European Microelectronics Packaging Conference, Friedrichshafen, Germany—September 2015, pp. 1-5; and M. Leitgeb: Advanced PCB Technologies—Miniaturisierung, Hochfrequenzanwendungen, Thermal Management, available with Austria Technologie & Systemtechnik Aktiengesellschaft of A-8700 Leoben (Austria)

are exemplary of advancements in the area of the disclosure.

BRIEF SUMMARY

One or more embodiments may also relate to a corresponding circuit and to a corresponding method. One or more embodiments may be applied, e.g., to semiconductor devices including highly-dissipative embedded dice, such as devices used in power applications.

The claims are an integral part of the technical disclosure of embodiments as provided herein.

One or more embodiments may include highly-dissipative embedded dice, where the die backside is (directly) connected, e.g., through a conductive glue to a thermally dissipative disk (e.g., a Cu disk) forming a thermally dissipative inlay.

One or more embodiments may apply to embedded die substrates in order to facilitate thermal dissipation performance close to a package surface mount.

One or more embodiments may include a commercial printed circuit board (PCB) for package exposed pad surface mount where a thermally conductive (e.g., copper) button of a round, square, or other shapes is embedded into the PCB, thus exposing its two surfaces.

One or more embodiments may include a top PCB, e.g., for package pad mount and/or a bottom PCB, e.g., for PCB attachment to thermal dissipator, heatsink, or board metal support.

One or more embodiments may involve attaching a die on a substrate layer, forming an, e.g., Cu inlay button and then following the standard steps of PCB layering and routing.

One or more embodiments may permit to maintain heat dissipation, e.g., through balls covering limited areas of the die or through a lead frame (LF).

One or more embodiments may facilitate thermal dissipation, e.g., in high-power applications.

As an alternative to leaving the back side of a die lying on a PCB layer, in one or more embodiments a PCB layer in contact with the back side of the die may include a thermally conductive inlay (e.g., a button-like Cu inlay) onto which the die may be arranged, e.g., adhesively with a thermally conductive glue.

In one or more embodiments a thermally conductive glue (K=6 W/mK) may be used, which facilitates achieving a good thermal performance of the whole system.

One or more embodiments may be used, e.g., in circuits and devices for automotive applications (e.g., in modules for engine control, antilock braking systems (ABS) and other suitable automotive modules).

BRIEF DESCRIPTION OF THE SEVERAL VIEWS OF THE DRAWINGS

One or more embodiments will now be described, by way of example only, with reference to the annexed figures, wherein:

FIG. 1 is a cross sectional view exemplary of one or more embodiments, and

FIG. 2 is another cross sectional view exemplary of one or more embodiments.

It will be appreciated that for the sake of clarity various parts or elements in the figures may not be drawn to scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 denotes a semiconductor device (this designation possibly extending also to a portion of a larger semiconductor device) including an embedded die or chip 12, namely a semiconductor chip or die arranged (fully) inside a package, including, e.g., organic (PCB) substrates as detailed in the following. The semiconductor die 12 is made from a semiconductor material, such as silicon, and includes an active surface in which one or more electrical components are formed. In one or embodiments, such an arrangement may facilitate reducing the overall package size.

In one or more embodiments, the die 12 may be coupled with a thermally conductive element 14 (e.g., a plate-like inlay such as a button-shaped inlay) which may include, e.g., Cu (copper), as the thermally conductive material.

In one or more embodiments, coupling the die 12 with the thermally conductive element 14 may include:

arranging the die 12 "on top" of the thermally conductive element 14 (as exemplified in FIG. 1), or arranging the thermally conductive element 14 "on top" of the die 12 (as exemplified in FIG. 2).

In one or more embodiments, coupling the die 12 with the thermally conductive element 14 may include adhesive connection via thermally conductive glue 16 (e.g., K=6 W/mK) or any other suitable adhesive material, which may facilitate heat transfer from (e.g., the bottom surface of) the die 12 to the thermally conductive element 14.

Merely by way of example (that is without any limitation to the embodiments), the die 12 may exhibit a die size 6×6 mm and the thermally conductive element 14 may include a "button", e.g., a disk-shaped circular copper inlay having a diameter of 8.9 mm, which corresponds to a 7.8×7.8 mm square pad.

In one or more embodiments, the die 12 may be located in a first (intermediate) PCB layer 18.

Similarly, in one or more embodiments, the thermally conductive element 14 may be located in a second PCB layer which may be either a lower layer 20 (FIG. 1) or an upper layer 22 (FIG. 2) in a stack of three (or possibly more) PCB layers 18, 20, 22 forming a layered package for the die 12.

Such electrically insulating (e.g., organic) layers may be produced with any known technique for that purpose.

In one or more embodiments, the thermally conductive element 14 being located in a lowermost layer 20 (FIG. 1) or in an uppermost layer 22 (FIG. 2) in the layered package may result in the thermally conductive element 14 being arranged at an outer position of the package having the die 12 embedded therein.

In one or more embodiments, the thermally conductive element 14 may face one of the two surfaces (bottom or top) of the substrate (layered structure). This may facilitate heat extraction with different methods, e.g., air, forced air, connection to board chassis, heatsink, heatspreader, an so on.

Whatever the specific arrangement adopted, in one or more embodiments, a top (front) surface 220 may become available in such a package for mounting, e.g., passive/ active components (not visible in FIG. 1) or a heat sink 24 (FIG. 2, with such a heat sink being possibly coupled to the thermally conductive element 14 by means of a thermally conductive (e.g., glue or any other suitable adhesive material) layer 240.

Whatever the specific arrangement adopted, in one or more embodiments, a bottom (back) surface 200 may become available in such a package for providing electrical contact formations to a supporting substrate S.

In one or more embodiments such a substrate S may include, e.g., mounting card for a circuit including one or more semiconductor devices 10 as exemplified herein mounted thereon. Power circuits for various applications, e.g., in the automotive area (engine control, ABS, and so on) may be exemplary of such a circuit.

In one or more embodiments, the electrical contact formations may include, e.g., land pads 260—in the Land-Grid-Array LGA-like arrangement exemplified in FIG. 1—or balls 280—in the Ball-Grid-Array BGA-like arrangement exemplified in FIG. 2.

In one or more embodiments, die pads 120 as provided at a surface of the die 12 may be arranged:

facing upwards, towards the front surface of the device 10, as exemplified in FIG. 1, or facing downwards, towards the back surface of the device 10, as exemplified in FIG. 2. That is, the active surface of the die 12 may be facing upward as shown in FIG. 1 or facing downward as shown in FIG. 2.

In one or more embodiments, electrically conductive vias 30 (produced by known means) may extend through the lower layer 20 (and the intermediate layer 18 in FIG. 1) in order to facilitate electrically coupling the die pads 120 with the electrical contact formations 260, 280.

In one or more embodiments as exemplified in FIG. 1, electrically conductive lines 310 at the interface between the intermediate layer 18 and the lower layer 20 may permit re-routing of the connection layout of the die pads 120 to the electrical contact formations 260.

In one or more embodiments as exemplified in FIG. 1, further electrically conductive vias 32 extending through the whole layered package (e.g., PCB layer stack) 18, 20, 22 may facilitate electrically coupling the contact formations 260 with connection lands 320 for passive/active components possibly mounted at the top (front) surface 220.

It will be otherwise appreciated that:

features and details disclosed herein in connection with one or more embodiments as exemplified in FIG. 1 may be applied to one or more embodiments as exemplified in FIG. 2 or vice-versa, the provision of one semiconductor die in a device as disclosed herein is merely exemplary: one or more embodiments may include a plurality of semiconductor chips embedded in a layered package (e.g., 18, 20, 22), the semiconductor chips possibly coupled with a common thermally conductive inlay or a plurality of respective, thermally conductive inlays.

One or more embodiments may thus provide a semiconductor device (e.g., 10) including a (electrically insulating) package (e.g., 18, 20, 22) having at least one semiconductor die (e.g., 12) embedded therein, the at least one semiconductor die coupled with a thermally-conductive element (e.g., 14) wherein the package includes a layered package with:

an intermediate layer (e.g., 18) with the at least one semiconductor die arranged therein, and a pair of outer layers (e.g., 20, 22) with the thermally-conductive element including a thermally-conductive inlay in one (20 in FIG. 1, 22 in FIG. 2) of said outer layers.

One or more embodiments may include the at least one semiconductor die coupled with the thermally-conductive inlay by means of a thermally-conductive coupling layer (e.g., 16), the thermally-conductive coupling layer optionally including thermally-conductive adhesive.

In one or more embodiments the thermally-conductive inlay may include a plate-like, optionally button-like inlay.

In one or more embodiments the thermally-conductive inlay may be any conductive material and in at least one embodiment includes copper.

In one or more embodiments, the layers in the layered package include printed circuit boards (PCBs).

In one or more embodiments, said pair of outer layers in the layered package may include a front layer with the thermally-conductive inlay in said front layer (22), wherein a heat sink member (e.g., 24) may be thermally coupled (e.g., at 240) with the thermally-conductive inlay at said front layer.

In one or more embodiments, said pair of outer layers in the layered package may include a front layer and a back layer, the back layer provided with electrical contact formations for the at least one semiconductor die, the electrical contact formations optionally including land pads (e.g., 260) or balls (e.g., 280).

One or more embodiments may include electrically conductive vias (e.g., 30) extending through at least the back layer of the layered package for facilitating electrical coupling between said electrical contact formations and die pads (e.g., 120) in said at least one semiconductor die.

In one or more embodiments:
the at least one semiconductor die may include die pads acing towards the back layer of the layered package with said electrically conductive vias extending (only) through the back layer of the layered package, or
the at least one semiconductor die may include die pads facing towards the front layer of the layered package with said electrically conductive vias extending through the intermediate layer and the back layer of the layered package.

One or more embodiments may include further electrically conductive vias (e.g., 32) extending through the layered package for facilitating electrical coupling between said electrical contact formations and electrical connection lands (e.g., 320) at the front layer of the layered package.

In one or more embodiments a circuit may include:
a substrate (e.g., S), and
at least one semiconductor device (e.g., 10) according to one or more embodiments.

In one or more embodiments, a method of producing a semiconductor device according to one or more embodiments may include providing a layered package having at least one semiconductor die embedded therein, wherein the method may include:
arranging the at least one semiconductor die in an intermediate layer of the layered package,
coupling the at least one semiconductor die with a thermally-conductive element,
providing a pair of outer layers in the layered package; and
providing the thermally-conductive element by including a thermally-conductive inlay in one of said outer layers.

Without prejudice to the underlying principles, the details and embodiments may vary, even significantly, with respect to what has been described in the foregoing by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device comprising:
at least one semiconductor die;
a package, the at least one semiconductor die embedded in the package, the at least one semiconductor die coupled to a thermally-conductive element, wherein the package includes a layered package including:
an intermediate layer, the at least one semiconductor die arranged in an opening in the intermediate layer;
first and second outer layers, the thermally-conductive element including a thermally-conductive inlay in the first outer layer, wherein the second outer layer is provided with electrical contact formations coupled to the at least one semiconductor die; and
a heat sink member thermally coupled to the thermally-conductive inlay.

2. The semiconductor device of claim 1, comprising a thermally-conductive coupling layer, wherein the at least one semiconductor die is coupled to the thermally-conductive inlay by the thermally-conductive coupling layer.

3. The semiconductor device of claim 1, wherein the thermally-conductive inlay is a circular-shaped plate.

4. The semiconductor device of claim 1, wherein the thermally-conductive inlay includes copper.

5. The semiconductor device of claim 1, wherein the semiconductor package is coupled to a printed circuit board.

6. A semiconductor device comprising:
at least one semiconductor die; and
a package, the at least one semiconductor die embedded in the package, the at least one semiconductor die coupled to a thermally-conductive element, wherein the package includes a layered package including:
an intermediate layer, the at least one semiconductor die arranged in an opening in the intermediate layer; and
first and second outer layers, the thermally-conductive element including a thermally-conductive inlay in one of the first and second outer layers,
wherein the second outer layer is provided with electrical contact formations coupled to the at least one semiconductor die, the electrical contact formations including at least one of land pads or balls.

7. The semiconductor device of claim 6, comprising first electrically conductive vias extending through at least the second outer layer of the layered package configured to electrically couple the electrical contact formations to traces or lands in the layered package.

8. The semiconductor device of claim 7, wherein:
the at least one semiconductor die includes die pads facing towards the second outer layer of the layered package with the first electrically conductive vias extending through the second outer layer of the layered package, or
the at least one semiconductor die includes die pads facing towards the first outer layer of the layered package with the first electrically conductive vias extending through the intermediate layer and the second outer layer of the layered package.

9. The semiconductor device of claim 7, comprising second electrically conductive vias extending through the first outer layer and electrically coupled to the electrical contact formations.

10. A system comprising:
a substrate, and
at least one semiconductor device mounted on the substrate, the at least one semiconductor device including:
a semiconductor die; and a package body, the semiconductor die fully embedded in the package body, the package body including first, second, and third layers that are vertically stacked, a thermally conductive element being laterally surrounded by the first layer, the semiconductor die being laterally surrounded by the second layer, the first layer and the thermally conductive element being on a first side of the semiconductor die, the third layer being on a second side of the semiconductor die.

11. The system of claim 10, wherein the substrate and the first, second, and third layers are printed circuit boards.

12. The system of claim 10, wherein the semiconductor device is mounted on the substrate such that the first layer and the thermally conductive element are closer to the substrate than the second and third layers.

13. The system of claim 10, wherein the semiconductor device is mounted on the substrate such that the third layer is closer to the substrate than the first and second layers.

14. The system of claim 13, further comprising a heat sink member thermally coupled to the thermally-conductive element.

15. A method comprising:
  forming a layered package, wherein forming the layered package includes:
    arranging a semiconductor die in an intermediate layer;
    coupling a thermally-conductive element to the semiconductor die;
    coupling a first layer to a first side of the intermediate layer and a first side of the semiconductor die, the first layer surrounding the thermally conductive element; and
    coupling a second layer to a second side of the intermediate layer and the second side of the semiconductor die; and
  thermally coupling a heat sink member to the thermally-conductive element.

16. The method of claim 15, wherein coupling the thermally-conductive element to the semiconductor die comprises coupling a surface of the thermally-conductive element to an active surface of the semiconductor die or coupling the surface of the thermally-conductive element to a back surface of the semiconductor die.

17. A method comprising:
  forming a layered package, wherein forming the layered package includes:
    arranging a semiconductor die in an intermediate layer;
    coupling a thermally-conductive element to the semiconductor die;
    coupling a first layer to a first side of the intermediate layer and a first side of the semiconductor die, the first layer surrounding the thermally conductive element, wherein coupling the thermally-conductive element to the semiconductor die occurs simultaneously with coupling the first layer to the first side of the intermediate layer and the first side of the semiconductor die; and
    coupling a second layer to a second side of the intermediate layer and the second side of the semiconductor die.

18. The method of claim 17, further comprising coupling a heat sink to the thermally-conductive element.

19. The method of claim 17, further comprising coupling the layered package to a substrate.

* * * * *